(12) United States Patent
Wang et al.

(10) Patent No.: US 10,833,461 B2
(45) Date of Patent: Nov. 10, 2020

(54) CONNECTORS FOR COAXIAL CABLES

(71) Applicant: CommScope Technologies LLC, Hickory, NC (US)

(72) Inventors: Rui Wang, Suzhou (CN); Haifei Qin, Suzhou (CN); Guomin Ding, Suzhou (CN); HongHui Chen, Suzhou (CN)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 16/662,255

(22) Filed: Oct. 24, 2019

(65) Prior Publication Data

US 2020/0203902 A1 Jun. 25, 2020

(30) Foreign Application Priority Data

Dec. 19, 2018 (CN) .......................... 2018 1 1554174

(51) Int. Cl.
| | |
|---|---|
| *H01R 24/50* | (2011.01) |
| *H01R 9/05* | (2006.01) |
| *H05K 1/02* | (2006.01) |
| *H01R 13/504* | (2006.01) |
| *H01B 11/18* | (2006.01) |
| *H01R 103/00* | (2006.01) |

(52) U.S. Cl.
CPC ......... *H01R 24/50* (2013.01); *H01B 11/1804* (2013.01); *H01R 9/0515* (2013.01); *H01R 13/504* (2013.01); *H05K 1/0243* (2013.01); *H01R 2103/00* (2013.01); *H05K 2201/09209* (2013.01)

(58) Field of Classification Search
CPC .............................. H01R 24/50; H01R 9/0515
USPC ............................................................ 439/63
See application file for complete search history.

(56) References Cited

U.S. PATENT DOCUMENTS

| | | | | | |
|---|---|---|---|---|---|
| 3,141,924 | A | * | 7/1964 | Forney, Jr. ........... | H01R 9/0512 174/75 C |
| 3,324,421 | A | * | 6/1967 | Fujimoto ............... | H01R 24/44 333/127 |
| 3,551,874 | A | * | 12/1970 | Volinskie ............. | H01R 24/542 439/63 |
| 3,742,425 | A | * | 6/1973 | Peltola ................. | H01R 9/0515 439/63 |
| 3,910,665 | A | * | 10/1975 | Stull ...................... | H01R 24/50 439/63 |
| 3,980,382 | A | * | 9/1976 | Reeder ................. | H01R 9/0515 439/581 |
| 4,257,667 | A | * | 3/1981 | Iantorno .............. | H01R 12/718 403/242 |

(Continued)

*Primary Examiner* — Alexander Gilman
(74) *Attorney, Agent, or Firm* — Myers Bigel, P.A.

(57) ABSTRACT

A connector for connecting a coaxial cable to a printed circuit board includes a support portion that receives an end of the coaxial cable within a hollow structure thereof so that an exposed outer conductor of the coaxial cable is connected to an interior surface of a side wall of the hollow structure and so that the coaxial cable extends within the support portion perpendicular to the printed circuit board. The connector further includes an engagement portion that is connected to the support portion and configured to fix the connector to a first side of the printed circuit board, where the engagement portion is mounted above a via hole in the printed circuit board.

22 Claims, 7 Drawing Sheets

(56) References Cited

U.S. PATENT DOCUMENTS

| | | | | |
|---|---|---|---|---|
| 4,453,796 A * | 6/1984 | Monroe | H01R 9/0518 | 439/581 |
| 4,534,602 A * | 8/1985 | Bley | H01R 13/658 | 439/63 |
| 4,645,288 A * | 2/1987 | Stursa | H01R 24/50 | 439/581 |
| 4,895,521 A * | 1/1990 | Grabbe | H01R 24/50 | 439/581 |
| 4,941,831 A * | 7/1990 | Tengler | H01R 24/44 | 439/579 |
| 5,046,966 A * | 9/1991 | Snyder | H01R 13/65802 | 439/579 |
| 5,055,068 A * | 10/1991 | Machura | H01R 24/50 | 439/581 |
| 5,199,887 A * | 4/1993 | Iacono | H01R 9/0515 | 439/581 |
| 5,711,676 A * | 1/1998 | Michael, III | H01R 9/0518 | 439/581 |
| 5,752,839 A * | 5/1998 | Fiacco | H01R 24/50 | 439/63 |
| 6,030,231 A * | 2/2000 | Sarkiniemi | H01R 24/50 | 439/63 |
| 6,468,089 B1 * | 10/2002 | Hubbard | H01R 24/50 | 439/63 |
| 6,488,512 B2 * | 12/2002 | Gonzales | H01R 24/50 | 439/63 |
| 6,808,395 B2 * | 10/2004 | Lin | H01R 9/0515 | 439/578 |
| 6,935,866 B2 * | 8/2005 | Kerekes | H01R 9/0515 | 439/629 |
| 6,998,944 B2 * | 2/2006 | Caplan | H01P 1/047 | 333/238 |
| 7,048,547 B2 * | 5/2006 | Gottwald | H01R 24/50 | 439/581 |
| 7,344,381 B2 * | 3/2008 | Kerekes | H01R 13/521 | 439/63 |
| 7,688,277 B2 * | 3/2010 | Brocheton | H01Q 1/1207 | 343/850 |
| 7,950,960 B2 * | 5/2011 | Olson | H01R 9/0512 | 439/584 |
| 8,777,637 B2 * | 7/2014 | Sun | H01R 9/0515 | 439/63 |
| 9,543,670 B2 * | 1/2017 | Montena | H01R 9/032 | |
| 2005/0272278 A1 * | 12/2005 | Staniszewski | H01R 13/5045 | 439/63 |

\* cited by examiner

CONNECTORS FOR COAXIAL CABLES

CROSS-REFERENCE TO RELATED APPLICATION

The present application claims priority to Chinese Patent Application Serial No. 201811554174.7, filed Dec. 19, 2018, the entire content of which is incorporated herein by reference.

FIELD

The present invention relates to connectors and multi-port connectors for connecting coaxial cables to printed circuit boards. In addition, the present invention also relates to coaxial cable assemblies, printed circuit board assemblies and antenna systems with the connectors.

BACKGROUND

Figure 1:
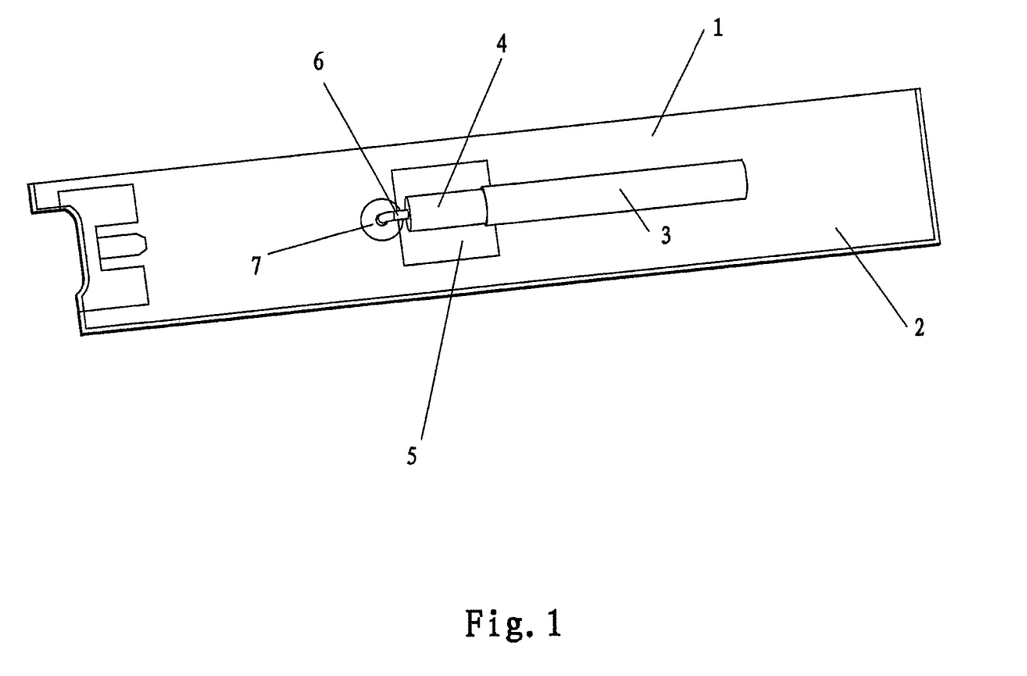
FIG. 1 is a schematic perspective view showing a conventional connection between a coaxial cable and a printed circuit board.

Coaxial cables are widely used in antenna systems as radio frequency (RF) transmission lines. FIG. 1 shows schematically a conventional connection between a coaxial cable 1 and a printed circuit board 2. As shown in FIG. 1, the coaxial cable 1 extends parallel to the printed circuit board 2. A cable jacket in the form of an insulating sheath 3 is stripped off one end of the coaxial cable 1 to expose an outer conductor 4. The exposed outer conductor 4 is soldered to an outer conductor pad 5 that is provided on one side of the printed circuit board 2. The outer conductor pad 5 is electrically connected to a ground layer (such as a ground copper layer) of the printed circuit board 2, so that the outer conductor 4 of the coaxial cable 1 is electrically connected to the ground copper layer of the printed circuit board 2 so that the outer conductor 4 is grounded.

An outer segment of the exposed outer conductor 4 is stripped off together with an insulating dielectric layer that is between the outer conductor 4 and an inner conductor 6 so as to expose the inner conductor 6 of the coaxial cable 1. A via hole 7 is provided immediately adjacent the outer conductor pad 5, and the inner conductor 6 is bent and extended through the via hole 7 in a direction perpendicular to the printed circuit board 2. The inner conductor 6 is soldered to a metal pattern on the other side of the printed circuit board 2. In this way, connection between the coaxial cable 1 and the printed circuit board 2 is achieved.

The above-described technique for connecting the coaxial cable 1 to the printed circuit board 2 has several disadvantages. First, the inner conductor 6 of the coaxial cable 1 is exposed to the ambient. Since the coaxial cable is used to transmit RF signals, which tend to radiate energy, the energy loss associated with the exposed inner conductor 6 may be significant. Second, the bent portion of the inner conductor 6 may generate a parasitic inductance, which may make it more difficult to achieve a good impedance match between the coaxial cable 1 and the printed circuit board 2, and hence may increase the return loss, and the influence of the parasitic inductance may become particularly significant when the system operates in a high frequency band. Third, the coaxial cable 1 and the printed circuit board 2 may not be accurately connected. In particular, as the outer conductor 4 extends parallel to the printed circuit board 2, the outer conductor 4 is engaged with the outer conductor pad 5 merely by one line of intersection, increasing the uncertainty of the engaging position. Especially in beamforming antennas, where a plurality of coaxial cables are provided for parallel transmission, the error caused by the uncertainty of the engaging position may deteriorate the phase synchronism among the coaxial cables, which may negatively affect the beamforming characteristics of the antennas.

SUMMARY

According to a first aspect of the present invention, a connector is provided. The connector is configured for connecting a coaxial cable to a printed circuit board, the coaxial cable having an exposed outer conductor on one end thereof and having an exposed inner conductor that extends beyond the exposed outer conductor, characterized in that the connector comprises: a support portion, which includes a hollow structure having a side wall, wherein the support portion is configured to receive one end of the coaxial cable within the hollow structure so that the exposed outer conductor is mechanically and electrically connected to an interior surface of the side wall such that the coaxial cable extends within the support portion perpendicular to the printed circuit board; and an engagement portion, which is connected to the support portion and configured to fix the connector to a first side of the printed circuit board, wherein the engagement portion is mounted above a via hole in the printed circuit board.

The connector according to the present invention is advantageous. Firstly, the inner conductor of the coaxial cable is located inside the connector without having to be exposed to the ambient, thereby reducing energy losses. Secondly, the inner conductor extends inside the connector in a direction substantially perpendicular to the printed circuit board, avoiding bending of the inner conductor and reducing return losses. Further, the connector is in surface engaging, rather than point or line engaging, with the printed circuit board, thereby improving the accuracy and consistency of the engaging position.

In some embodiments, the hollow structure is cylindrical or tapered.

In some embodiments, the exposed outer conductor is retained within the hollow structure, and the further exposed inner conductor is electrically connected to a metal pattern on the first side or on a second side opposing the first side of the printed circuit board.

In some embodiments, the hollow structure is arranged above and aligned with the via hole.

In some embodiments, the exposed outer conductor is retained within the hollow structure, and the exposed inner conductor extends through the hollow structure and the via hole and is electrically connected to a metal pattern on a second side opposing the first side of the printed circuit board.

In some embodiments, an electrical conductor is mounted within the via hole that extends within the hollow structure, and the exposed inner conductor is connected to the electrical conductor, which is further connected to a printed wiring of a metal pattern on the first side or an opposite second side of the printed circuit board.

In some embodiments, at least one window is provided in the support portion.

In some embodiments, the exposed outer conductor is soldered to the side wall of the support portion.

In some embodiments, the exposed outer conductor is connected to the side wall of the support portion by crimping or additional fasteners.

In some embodiments, the engagement portion is electrically connected to the printed circuit board.

In some embodiments, the engagement portion is located below the support portion and includes one or more flanges that extend radially outward from the side wall of the support portion.

In some embodiments, the flanges are spaced apart from one another by gaps.

In some embodiments, the printed circuit board is provided with a bond pad, and the flanges are soldered to the bond pad.

In some embodiments, the connector connects the coaxial cable to a side of the printed circuit board that is adjacent a ground element, and the engagement portion is configured for electrical connection with the ground element.

In some embodiments, the engagement portion is configured to engage the ground element of the printed circuit board by means of soldering, plugging, or additional mechanical structures.

In some embodiments, the ground element is configured as a ground layer on the printed circuit board, or as a ground structure that is electrically connected with the ground layer.

In some embodiments, the connector is configured as a metal connector.

In some embodiments, the connector includes a plastic body and a metal layer constructed on the plastic body.

In some embodiments, the metal layer is configured for electrical and mechanical connection with the exposed outer conductor.

According to a second aspect of the present invention, there is provided a multi-port connector configured to connect a plurality of coaxial cables to a printed circuit board, the plurality of coaxial cables each having an exposed outer conductor exposed on one end thereof and an exposed inner conductor that extends beyond the exposed outer conductor, characterized in that, the multi-port connector comprises: a plurality of support portions that each include a hollow structure having a side wall, wherein each support portion is configured to receive an end of a respective one of the coaxial cables so that the respective exposed outer conductor is mechanically and electrically connected to an interior surface of the respective side walls such that corresponding coaxial cables extend within the respective support portions perpendicular to the printed circuit board; and an engagement portion that is connected to the plurality of support portions and configured to fix the connector to a first side of the printed circuit board.

In some embodiments, the plurality of support portions are integrated on the engagement portion at least in one row.

In some embodiments, the plurality of support portions are spaced apart from one another or in abutment against each other.

In some embodiments, the hollow structure is cylindrical or tapered.

In some embodiments, the exposed outer conductor is retained within the hollow structure, and the exposed inner conductor is electrically connected to a trace of a metal pattern on the first side or on a second side opposing the first side of the printed circuit board.

In some embodiments, the printed circuit board is provided with a plurality of via holes, and each of the hollow structures is configured to surround a respective one of the via holes.

In some embodiments, the exposed outer conductor is retained within the hollow structure, and the exposed inner conductor extends through the hollow structure and the via hole and is electrically connected to a trace of a metal pattern on a second side opposing the first side of the printed circuit board.

In some embodiments, the via hole is provided therein with an electrical conductor surrounded by the hollow structure, and the exposed inner conductor is connected to the electrical conductor, which is further connected to a trace of a metal pattern on the first side or an opposite second side of the printed circuit board.

In some embodiments, at least one window is constructed on the support portion.

In some embodiments, the exposed outer conductor is soldered to the side wall of the support portion.

In some embodiments, the exposed outer conductor is connected to the side wall of the support portion by crimping or additional fasteners.

In some embodiments, the engagement portion is soldered to or plugged into the printed circuit board, or fixed to the printed circuit board by means of additional mechanical structure.

In some embodiments, the engagement portion is located below the support portion and includes one or more flanges that extend radially outward from the side wall of the support portion.

In some embodiments, the flanges are spaced apart from one another by gaps.

In some embodiments, the printed circuit board is provided thereon with a bond pad, and the flange is soldered to the bond pad.

In some embodiments, the connector connects the coaxial cable to a side of the printed circuit board that is adjacent a ground element, and the engagement portion is configured for electrical connection with the ground element.

In some embodiments, the engagement portion is configured to engage the ground element of the printed circuit board by soldering, plugging, or additional mechanical structure.

In some embodiments, the ground element is configured as a ground layer on the printed circuit board, or as a ground structure that is electrically connected to the ground layer.

In some embodiments, the multi-port connector is configured as a metal multi-port connector.

In some embodiments, the multi-port connector includes a plastic body and a metal layer that is formed on the plastic body.

In some embodiments, the metal layer is configured for electrical and mechanical connection to the outer conductor of the coaxial cable.

According to a third aspect of the present invention, there is provided a coaxial cable assembly. The coaxial cable assembly comprises the connector according to the first aspect of the present invention, and a coaxial cable mounted thereon, or comprises the multi-port connector according to the second aspect of the present invention and a plurality of coaxial cables mounted thereon.

According to a fourth aspect of the present invention, a printed circuit board assembly is provided. The printed circuit board assembly includes a printed circuit board, and the connector according to the first aspect of the present invention or the multi-port connector according to the second aspect of the present invention mounted on the printed circuit board.

According to a fifth aspect of the present invention, an antenna system is provided. The antenna system comprises the coaxial cable assembly according to the third aspect of the present invention, or comprises the printed circuit board assembly according to the fourth aspect of the present invention.

DETAILED DESCRIPTION

Embodiments of the present invention will be described below with reference to the drawings, in which several embodiments of the present invention are shown. It should be understood, however, that the present invention may be implemented in many different ways, and is not limited to the example embodiments described below. In fact, the embodiments described hereinafter are intended to make a more complete disclosure of the present invention and to adequately explain the scope of the present invention to a person skilled in the art. It should also be understood that, the embodiments disclosed herein can be combined in various ways to provide many additional embodiments.

It should be understood that, the wording in the specification is only used for describing particular embodiments and is not intended to limit the present invention. All the terms used in the specification (including technical and scientific terms) have the meanings as normally understood by a person skilled in the art, unless otherwise defined. For the sake of conciseness and/or clarity, well-known functions or constructions may not be described in detail.

The singular forms "a/an" and "the" as used in the specification, unless clearly indicated, all contain the plural forms. The words "comprising", "containing" and "including" used in the specification indicate the presence of the claimed features, but do not preclude the presence of one or more additional features. The wording "and/or" as used in the specification includes any and all combinations of one or more of the relevant items listed.

In the specification, words describing spatial relationships such as "up", "down", "left", "right", "forth", "back", "high", "low" and the like may describe a relation of one feature to another feature in the drawings. It should be understood that these terms also encompass different orientations of the apparatus in use or operation, in addition to encompassing the orientations shown in the drawings. For example, when the apparatus in the drawings is turned over, the features previously described as being "below" other features may be described to be "above" other features at this time. The apparatus may also be otherwise oriented (rotated 90 degrees or at other orientations) and the relative spatial relationships will be correspondingly altered.

It should be understood that, in all the drawings, the same reference signs present the same elements. In the drawings, for the sake of clarity, the sizes of certain features may be modified.

Techniques according to embodiments of the present invention for connecting a coaxial cable 1 to a printed circuit board 2 will be described below with reference to FIGS. 2 to 6.

Figure 2:
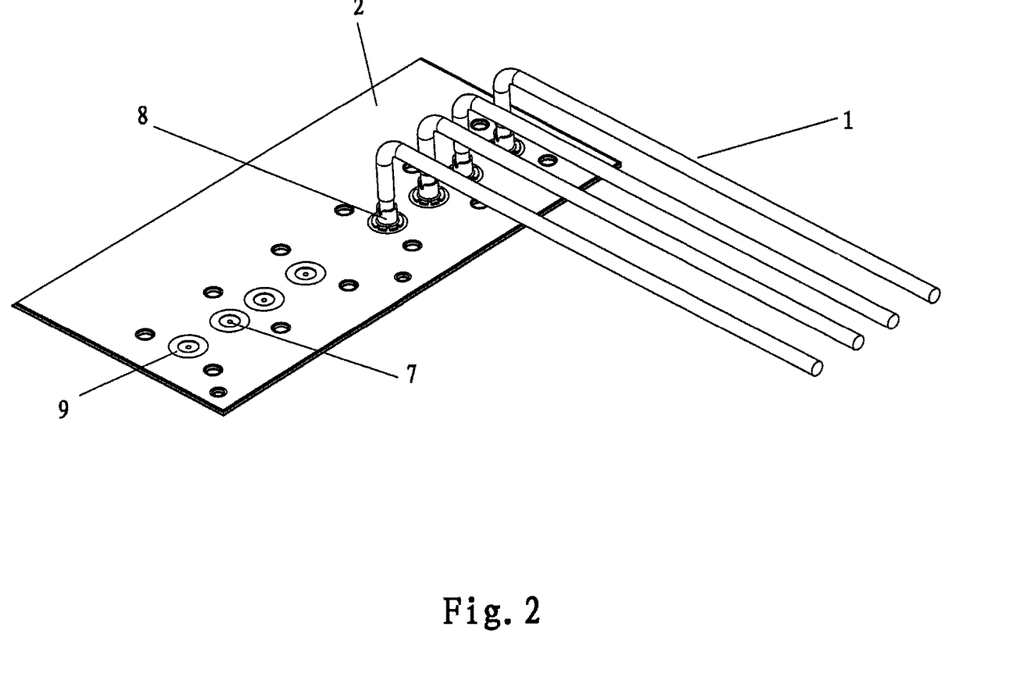
FIG. 2 is a schematic top perspective view showing connections between several coaxial cables and a printed circuit board according to embodiments of the present invention.

As shown in FIG. 2, multiple coaxial cables 1 may be connected to a printed circuit board 2 using a plurality of connectors 8 according to embodiments of the present invention. An end of each coaxial cable 1 is inserted into a respective connector 8 that is mounted on the printed circuit board 2 to achieve these connections.

Figure 3:
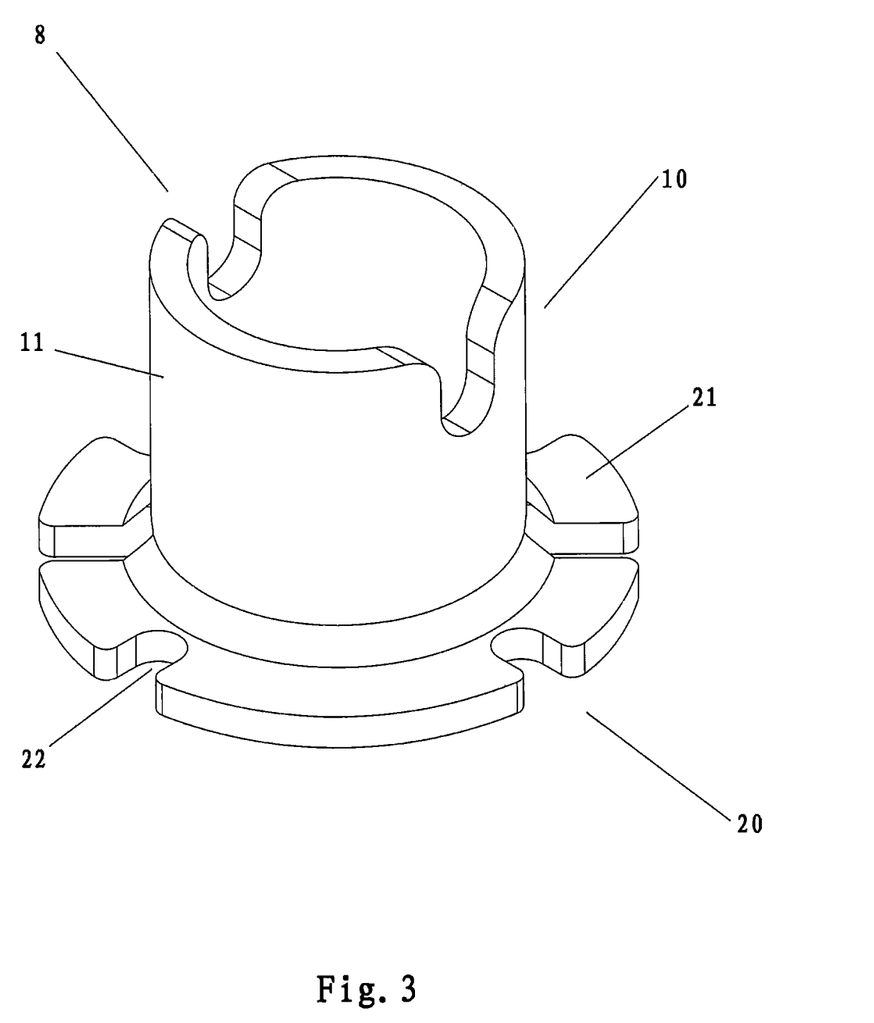
FIG. 3 is a schematic perspective view of a connector according to embodiments of the present invention.

FIG. 3 shows the connector 8 according to embodiments of the present invention, which is used for connecting the coaxial cable 1 to the printed circuit board 2. The connector 8 is substantially cylindrical and includes a support portion 10 and an engagement portion 20. The support portion 10 is located above and connected to the engagement portion 20. In this embodiment, the support portion 10 may be formed in one piece with the engagement portion 20. In other embodiments, the support portion 10 may also be formed as a separate component from the engagement portion 20, for example, the two portions are engaged together by soldering or by an interference fit. The support portion 10 is used to support a corresponding coaxial cable 1 that extends perpendicular to the printed circuit board 2, whereas the engagement portion 20 is used to bond the connector 8 to the printed circuit board 2. The connector 8 may be formed of metal (for example, a copper connector or an aluminum connector). In other embodiments, the connector 8 may also be constructed as a connector plated with metal. For example, the connector 8 may include a plastic body and a metal layer formed on at least portions of the plastic body. This can reduce manufacturing costs, and the effective control of costs is particularly advantageous in the case of mass production.

Figure 4:
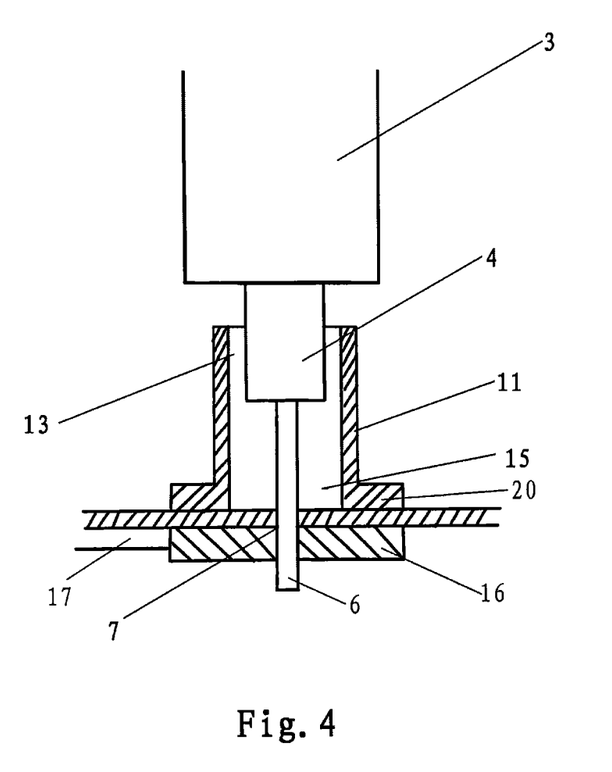
FIG. 4 is a cross-sectional view showing the connector of FIG. 3 being used to connect a coaxial cable to a printed circuit board.

The support portion 10 has a hollow interior, and hence a channel extends through the support portion 10. In the embodiment of FIG. 3, the support portion 10 has a hollow cylindrical structure. In other embodiments, the support portion 10 may also be configured in any other shape (e.g., being tapered). The shape of the outside of the support portion 10 may differ from the shape of the channel extending therethrough (e.g., the support portion may have a hexagonal exterior shape and a cylindrical channel). As shown in FIGS. 3 and 4, the support portion 10 includes a cylindrical side wall 11. The support portion 10 has a first opening 13 at a first end and a second opening 15 at an opposite second end. An end of the coaxial cable 1 with an outer conductor exposed is inserted into the connector 8 via the first opening 13, and the exposed inner conductor 6 extends out of the second opening 15.

The engagement portion 20 includes one or more flanges 21 that extend radially outward from the lower end of the side wall 11 of the support portion 10. The flanges 21 may be spaced apart from one another by one or more gaps 22. The gaps 22 facilitate relief of stress. In addition, the gaps 22 can also prevent heat from being transferred too fast, which is advantageous in the case of manual soldering. The flange 21 is fixed to the printed circuit board 2 by, for example, being soldered to a bond pad 9 (see FIG. 2) that is provided on the printed circuit board 2. In other embodiments, the engagement portion 20 may also be plugged into the printed circuit board 2, or fixed to the printed circuit board 2 via fasteners (such as screws, plastic fasteners, etc.).

FIG. 4 is a cross-sectional view of the connector 8 with a coaxial cable 1 inserted therein. The printed circuit board 2 includes a via hole 7, and the bond pad 9 is disposed around the via hole 7 (see FIG. 2). The engagement portion 20 of the connector 8 is soldered to the bond pad 9 and the side wall 11 of the support portion 10 surrounds the via hole 7. An insulating sheath 3 (e.g., a cable jacket) is removed from one end of the coaxial cable 1 to expose an outer conductor 4. The outer conductor 4 surrounds an insulating dielectric layer (not shown), and the insulating dielectric layer surrounds an inner conductor 6. An outer segment of the exposed outer conductor 4 is stripped off together with the corresponding insulating dielectric layer to expose the inner conductor 6. The end of the coaxial cable 1 with the exposed outer and inner conductors 4, 6 is inserted into the connector 8 via the first opening 13. The outer conductor 4 of the coaxial cable 1 is soldered to the support portion 10 of the connector 8 (for example by a solder ring). As the bond pad 9 is electrically connected to the ground copper layer of the printed circuit board 2, an electrically conductive path is established among the outer conductor 4 of the coaxial cable 1, the support portion 10, the engagement portion 20, the bond pad 9 and the ground copper layer of the printed circuit board 2, thereby electrically connecting the outer conductor 4 to ground. In other embodiments, electrical and mechanical connection between the support portion 10 and the outer conductor 4 of the coaxial cable 1 may be achieved by other means, for example, by crimping or additional fasteners (e.g., a cable tie).

While electrical and mechanical connection is achieved between the outer conductor 4 and the support portion 10, the further exposed inner conductor 6 extends through the second opening 15 and through the via hole 7 in the printed circuit board 2 so that the center conductor extends from the other side of the printed circuit board 2 (i.e., the side opposite the side on which the connector 8 is mounted). With continued reference to FIG. 5, a metal pattern is provided on the other side of the printed circuit board 2 that includes pads 16 that are connected to respective metal traces 17. Each exposed inner conductor 6 is soldered to a respective one of the pads 16 on the other side of the printed circuit board 2, thereby electrically and mechanically connecting each inner conductor 6 to a respective one of the traces 17 on the other side of the printed circuit board 2.

Figure 5:
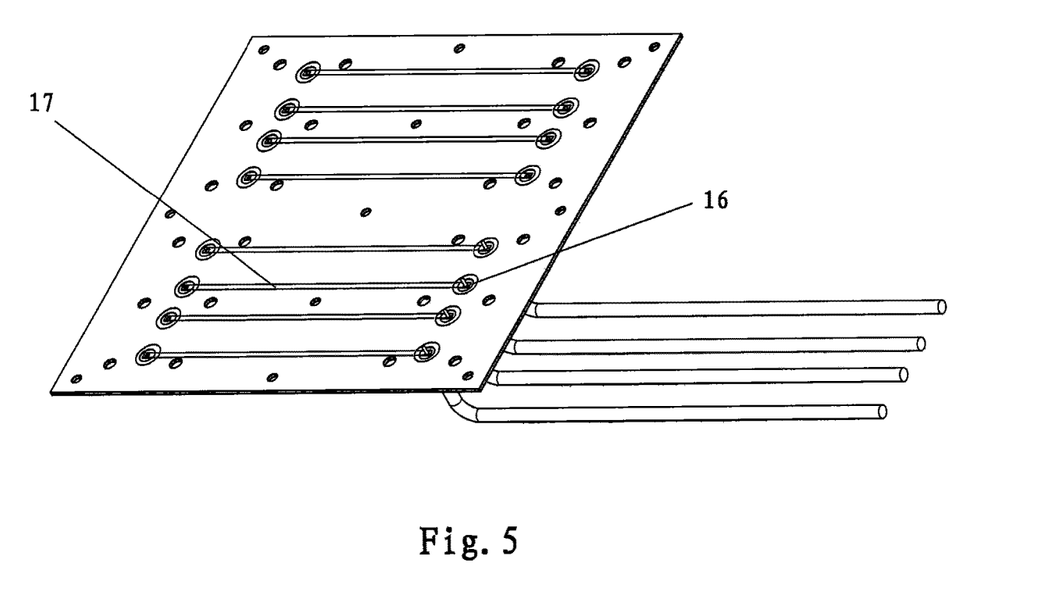
FIG. 5 is a schematic bottom perspective view of the coaxial cables and printed circuit board of FIG. 2.

Thus, as explained above, the outer conductor 4 of coaxial cable 1 is electrically connected to the ground copper layer on one side of the printed circuit board 2, and the inner conductor 6 of the coaxial cable 1 is electrically connected to the metal trace 17 of the metal pattern on the other side of the printed circuit board 2. The metal trace 17 and the ground copper layer form an RF transmission line on the printed circuit board 2. Thus, the connector 8 may be used to electrically connect the coaxial cable 1 to the RF transmission line on the printed circuit board 2, so that signals from the coaxial cable 1 can be transmitted on the printed circuit board 2.

In some embodiments, the outer conductor 4 of the coaxial cable 1 may be soldered to the connector 8 before the connector 8 is soldered to the bond pad 9 on the printed circuit board 2. In other embodiments, the connector 8 may be soldered to the corresponding bond pad 9 before the coaxial cable 1 is soldered to the connector 8. The end of the coaxial cable 1 can be engaged with the printed circuit board 2 in a direction perpendicular to the printed circuit board 2 while being kept within the connector 8.

The above-described technique for connecting the coaxial cable 1 to the printed circuit board 2 may have several advantages. First, most of the inner conductor 6 of the coaxial cable 1 is located inside the connector 8 without being exposed to the ambient, thereby reducing radiation losses. Second, the inner conductor 6 extends inside the connector 8 in a direction that is substantially perpendicular to the printed circuit board, and hence it is not necessary to bend the inner conductor 6 which can result in increased return loss. Further, the connector 8 engages the outer conductor 4 on all sides (i.e., is surface engaging rather than point or line engaging), and the connector 8 likewise engages the printed circuit board over a two-dimensional surface, thereby improving the accuracy and consistency of the engaging position.

Figure 6:
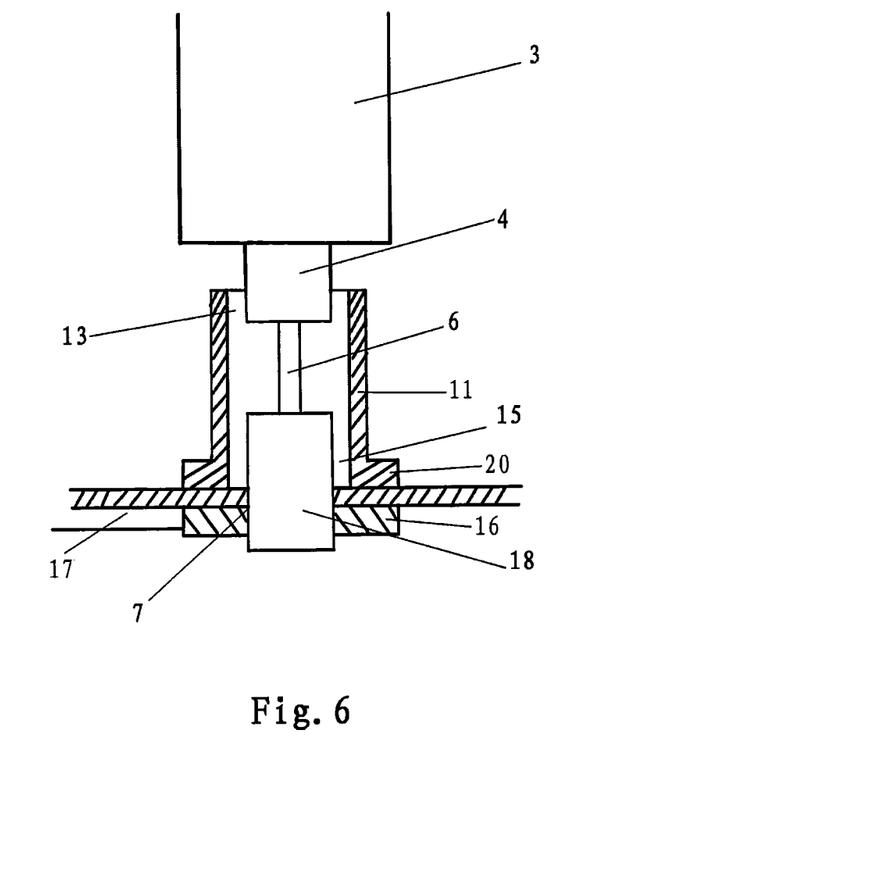
FIG. 6 is another cross-sectional view showing the connector of FIG. 3 being used to connect a coaxial cable to a printed circuit board.

FIG. 6 is another cross-sectional view of the connector 8 with a coaxial cable 1 inserted therein. As shown in FIG. 6, an electrical conductor 18 is attached to the printed circuit board 2. The electrical conductor 18 extends through the via hole 7 in the printed circuit board 2 and is soldered to the trace 17 of the metal pattern. The engagement portion 20 of the connector 8 is soldered to the bond pad 9, and the side wall 11 of the support portion 10 surrounds the electrical conductor 18. In this embodiment, the inner conductor 6 does not extend through the second opening 15 of the support portion 10 and the via hole 7 to the other side of the printed circuit board 2. Instead, the inner conductor 6 is retained inside the support portion 10 and is electrically and mechanically connected to the electrical conductor 18 by soldering in order to electrically connect the coaxial cable 1 to the printed circuit board 2, and RF signals can be effectively transmitted to the trace 17. In other embodiments, the electrical connection between the inner conductor 6 and the electrical conductor 18 may also be achieved by crimping, plugging, or the like. At least one window (not shown) may be formed on the support portion 10 to allow a tool that is used to form the electrical connection between the inner conductor 6 and the electrical conductor 18 to pass therethrough, such as a soldering or crimping tool.

In the embodiments described above, the connector 8 is configured to connect the coaxial cable 1 to the back side of the printed circuit board 2, that is, the side on which the ground copper layer is formed. In other embodiments, the connector 8 may also be configured to connect the coaxial cable 1 to the front side of the printed circuit board 2, that is, the side that includes the metal pattern. In such embodiments, the engagement portion 20 of the connector 8 may be electrically connected to a ground element on the front side of the printed circuit board 2, which ground element is further electrically connected to the ground copper layer on the back side of the printed circuit board 2.

Figure 7:
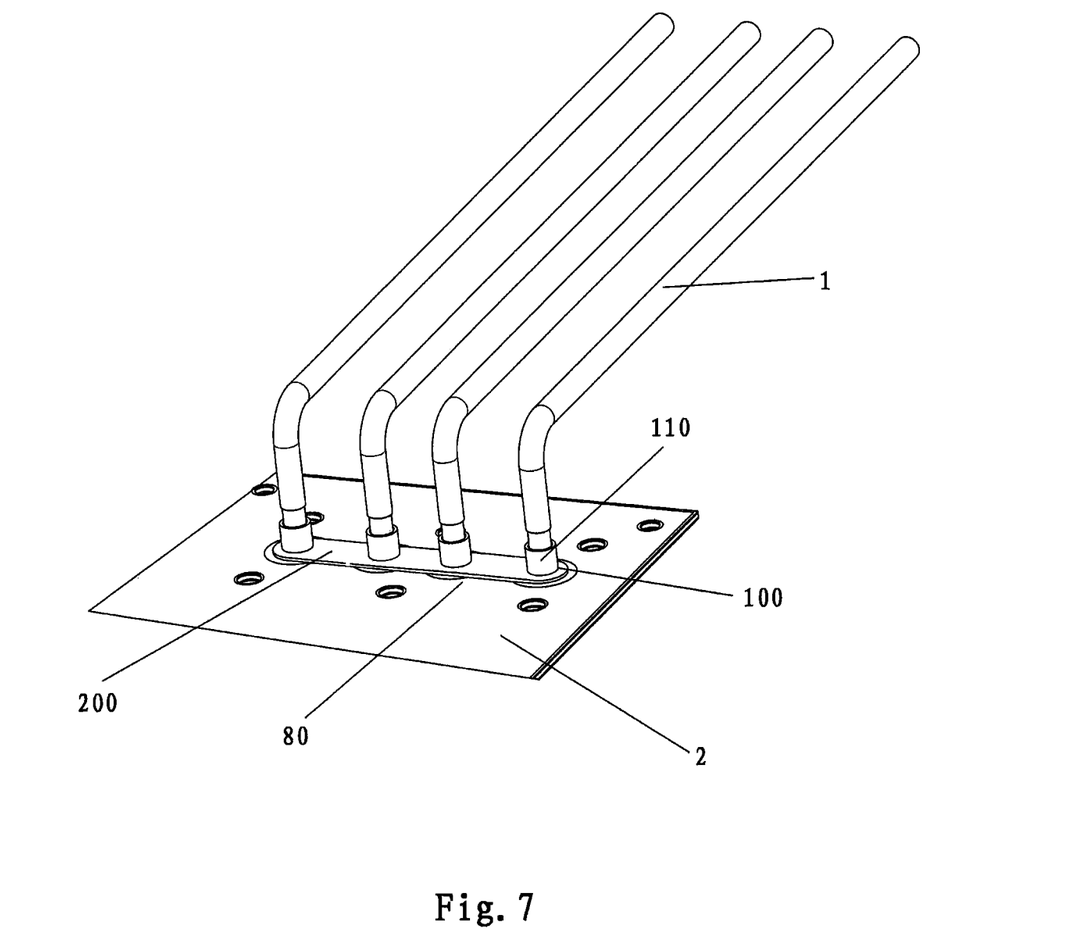
FIG. 7 is a schematic perspective view of a multi-port connector according to embodiments of the present invention.

A multi-port connector 80 is illustrated in FIG. 7. As shown in FIG. 7, the multi-port connector 80 is configured to connect multiple coaxial cables 1 to the printed circuit board 2. In this embodiment, the multi-port connector 80 includes four support portions 100, and one engagement portion 200 that is located below the support portions 100. The support portions 100 are each have a hollow structure with a side wall 110. The engagement portion 200 projects radially outward from the side wall 110 of each support portion 100 to form an elongated plate. The four support portions 100 are spaced apart from each other on the engagement portion 200 in one row. In other embodiments, the multi-port connector 80 may include more or fewer support portions 100. The support portions 100 may also be integrated on the engagement portion 200 in multiple rows. The support portions 100 may be formed in one piece with the engagement portion 200. In other embodiments, the support portions 100 may also be formed as separate components from the engagement portion 200, for example, they may be connected together by soldering or by interference fit.

Similarly, the ends of the coaxial cables 1 with the exposed outer conductors 4 are inserted into the hollow structures of the corresponding support portions 100 respectively, and the exposed outer conductors 4 are mechanically and electrically connected to the side walls 110 of the hollow structures directly, for example, by soldering. The engagement portion 200 of the multi-port connector 80 is soldered to the bond pads 9. As the bond pads 9 are electrically connected to the ground copper layer of the printed circuit board 2, the outer conductors 4 of the plurality of coaxial cables 1 are grounded respectively. Further, a plurality of via holes 7 are provided on the printed circuit board 2. The hollow structure of each support portion 100 is configured to surround a corresponding via hole 7. The exposed inner conductors 6 extend toward the printed circuit board 2 and through the via holes 7 in the printed circuit board 2 to the other side of the printed circuit board 2, respectively. On the other side of the printed circuit board 2, the inner conductors 6 of the coaxial cables 1 are connected to the traces 17 of the metal pattern respectively. In this way, effective connection is achieved between the coaxial cables 1 and the printed circuit board 2, so that signals from the multiple coaxial cables 1 can be transmitted successfully to the printed circuit board 2.

This technique for connecting the coaxial cables 1 and the printed circuit board 2 can simplify the installation process. Especially in beamforming antennas, there are usually provided multiple coaxial cables for parallel transmission. If each coaxial cable is equipped with one connector, the installation process may be relatively cumbersome. This means of construction based on the multi-port connector 80 enables the entire multi-port connector 80 to be mounted onto the printed circuit board 2, for example, merely by soldering once. Then, each of the coaxial cables 1 is inserted into a corresponding support portion 100 to electrically and mechanically connect each of the coaxial cables 1 to the corresponding support portions 100.

Although the exemplary embodiments of the present invention have been described, a person skilled in the art should understand that, multiple changes and modifications may be made to the exemplary embodiments without substantively departing from the spirit and scope of the present invention. Accordingly, all the changes and modifications are encompassed within the protection scope of the present invention as defined by the claims. The present invention is defined by the appended claims, and the equivalents of these claims are also contained therein.

That which is claimed is:

1. A connector configured for connecting a coaxial cable to a printed circuit board, the coaxial cable having an exposed outer conductor on one end portion thereof and having an exposed inner conductor that extends beyond the exposed outer conductor, the connector comprising:
   a support portion, which includes a hollow structure having a side wall, wherein the support portion is configured to receive one end portion of the coaxial cable within the hollow structure so that the exposed outer conductor is mechanically and electrically connected to an interior surface of the side wall and so that the coaxial cable extends within the support portion perpendicular to the printed circuit board; and
   an engagement portion, which is connected to the support portion and configured to affix the connector to a first side of the printed circuit board, wherein the engagement portion is mounted above a via hole in the printed circuit board,
   wherein the engagement portion of the connector is configured to reside closer to the printed circuit board than the support portion of the connector, and
   wherein the connector has a unitary body with the support portion merging into the engagement portion, and wherein the engagement portion has a height in a height dimension aligned with a thickness of the printed circuit board, that is less than a height of the support portion.

2. The connector according to claim 1, wherein the hollow structure is aligned with the via hole, wherein the engagement portion terminates at and/or above the first side of the printed circuit board, and wherein the engagement portion is attached to the first side of the printed circuit board.

3. The connector according to claim 2, wherein the exposed outer conductor extends into and terminates inside the hollow structure, and wherein the exposed inner conductor extends through a portion of the hollow structure, through the engagement portion and through the via hole and is electrically connected to a metal pattern on a second side of the printed circuit board that opposes the first side of the printed circuit board.

4. The connector according to claim 1, wherein an electrical conductor is mounted within the via hole and extends into the support portion of the connector, wherein the exposed inner conductor is connected to the electrical conductor, which is further connected to a metal pattern on the first side or an opposite second side of the printed circuit board.

5. The connector of claim 4, wherein the exposed inner conductor terminates above the printed circuit board inside the support portion and inside the electrical conductor.

6. The connector according to claim 1, wherein the engagement portion is electrically connected to the printed circuit board.

7. The connector according to claim 1, wherein the engagement portion includes one or more flanges that extend radially outward from the side wall of the support portion, and wherein the flanges are circumferentially spaced apart from one another by gaps and reside against the first side of the printed circuit board.

8. The connector according to claim 1, wherein the connector connects the coaxial cable to a side of the printed circuit board that is adjacent a ground element, and the engagement portion is configured for electrical connection with the ground element.

9. The connector of claim 1, further comprising a first bond pad on the first side of the printed circuit board surrounding the via and coupled to the engagement portion of the connector and a second bond pad on an opposing side of the printed circuit board surrounding the via and coupled to a metal pattern.

10. A multi-port connector that is configured to connect a plurality of coaxial cables to a printed circuit board, the plurality of coaxial cables each having an exposed outer conductor exposed on one end thereof and an exposed inner conductor that extends beyond the exposed outer conductor, the multi-port connector comprising:
   a plurality of support portions that each include a hollow structure having a side wall, wherein each support portion is configured to receive an end of a respective one of the coaxial cables so that the respective exposed outer conductor is mechanically and electrically connected to an interior surface of the respective side walls such that corresponding coaxial cables extend within the respective support portions perpendicular to the printed circuit board; and an engagement portion that is connected to the plurality of support portions and configured to affix the multi-port connector to a first side of the printed circuit board.

11. The multi-port connector according to claim 10, wherein the plurality of support portions are integrated on the engagement portion at least in one row.

12. The multi-port connector according to claim 10, wherein the printed circuit board includes a plurality of via holes, and each of the hollow structures is configured to surround a respective one of the via holes, wherein the engagement portion terminates at and/or above the first side of the printed circuit board, and wherein the engagement portion is attached to the first side of the printed circuit board.

13. The multi-port connector according to claim 12, wherein the exposed outer conductor of a first of the coaxial cables is retained within and terminates inside a first of the hollow structures, and the exposed inner conductor of the first of the coaxial cables extends through a portion of the first of the hollow structures and a first of the via holes and is electrically connected to a trace of a metal pattern on a second side of the printed circuit board that opposes the first side of the printed circuit board.

14. The multi-port connector according to claim 10, wherein an electrical conductor is disposed in a first of the via holes and extends into a first of the hollow structures, wherein the exposed inner conductor is connected to the electrical conductor and terminates inside the first of the hollow structures, and wherein the electrical conductor is further connected to a trace of a metal pattern on the first side or an opposite second side of the printed circuit board.

15. The multi-port connector according to claim 10, wherein the exposed outer conductor of a first of the coaxial cables is soldered to the side wall of the support portion.

16. The multi-port connector according to claim 10, wherein the engagement portion is located closer to the printed circuit board than the support portion and includes one or more flanges that extend radially outward from the side wall of the support portion, and wherein the one or more flanges are attached to the first side of the printed circuit board.

17. The multi-port connector according to claim 16, wherein the printed circuit board includes a bond pad, and one or more of the flanges is soldered to the bond pad.

18. The multi-port connector according to claim 10, wherein the multi-port connector connects a first of the coaxial cables to a side of the printed circuit board that is adjacent a ground element, and the engagement portion is configured for electrical connection with the ground element.

19. The multi-port connector according to claim 18, wherein the engagement portion is configured to engage the ground element of the printed circuit board by soldering, plugging, or additional mechanical structure.

20. The multi-port connector according to claim 10, wherein the multi-port connector includes a plastic body and a metal layer that is formed on the plastic body wherein the plastic body has a three-dimensional shape with a planar elongate segment defining the engagement portion and with outwardly projecting members extending therefrom defining the support portions.

21. The multi-port connector of claim 10, wherein the support portions and the engagement portion define a three-dimensional body configured with the support portions projecting outwardly from the engagement portion with open spaces between the support portions, and wherein the engagement portion has a height in a height dimension aligned with a thickness of the printed circuit board, that is less than a height of the support portions.

22. A connector assembly, comprising:

a printed circuit board comprising a first primary surface and an opposing second primary surface with a plurality of vias extending therebetween, the first primary surface comprising a plurality of metal pads extending about the vias, the second primary surface comprising a plurality of metal pads extending about the vias;

a coaxial cable having an exposed outer conductor on one end portion thereof and having an exposed inner conductor that extends beyond the exposed outer conductor; and a connector coupling the coaxial cable to the printed circuit board, the connector comprising a support portion and an engagement portion, wherein the support portion has a longitudinally extending through channel enclosed by a side wall, wherein the support portion is configured to receive the one end portion of the coaxial cable within the channel so that the exposed outer conductor is mechanically and electrically connected to an interior surface of the side wall and so that the coaxial cable extends within the support portion perpendicular to the printed circuit board, wherein the engagement portion couples the connector to the printed circuit board, wherein the engagement portion is attached to one of the metal pads on the first side of the printed circuit board and terminates at and/or above the first side of the printed circuit board.

* * * * *

UNITED STATES PATENT AND TRADEMARK OFFICE
CERTIFICATE OF CORRECTION

| | | |
|---|---|---|
| PATENT NO. | : 10,833,461 B2 | Page 1 of 1 |
| APPLICATION NO. | : 16/662255 | |
| DATED | : November 10, 2020 | |
| INVENTOR(S) | : Wang et al. | |

It is certified that error appears in the above-identified patent and that said Letters Patent is hereby corrected as shown below:

On the Title Page (30) Foreign Application Priority Data:
Please correct "201811554174" to read -- 201811554174.7 --

In the Claims

Column 12, Line 10, Claim 20:
Please correct "body wherein" to read -- body, wherein --

Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*